United States Patent [19]

Johnson

[11] 4,201,820
[45] May 6, 1980

[54] MICROCELLULAR HETEROCYCLIC POLYMER STRUCTURES

[75] Inventor: Burnett H. Johnson, Baytown, Tex.

[73] Assignee: Exxon Research & Engineering Co., Florham Park, N.J.

[21] Appl. No.: 866,442

[22] Filed: Jan. 3, 1978

Related U.S. Application Data

[60] Continuation-in-part of Ser. No. 643,062, Dec. 22, 1975, abandoned, which is a division of Ser. No. 356,924, May 3, 1973, abandoned.

[51] Int. Cl.$^2$ .................. B32B 3/14; B32B 15/08
[52] U.S. Cl. ............................. 428/195; 428/209; 428/332; 428/901; 430/537
[58] Field of Search ............ 428/901, 195, 209, 332; 260/2.5 N, 2.5 R; 96/36.2

[56]  References Cited

U.S. PATENT DOCUMENTS

| 3,397,106 | 8/1968 | Moseley | 428/105 |
| 3,591,562 | 7/1971 | Patton | 260/2.5 N |
| 3,635,905 | 1/1972 | Patton | 260/2.5 N |
| 3,661,859 | 5/1972 | Patton | 260/2.5 R |
| 4,017,371 | 4/1977 | Morgan | 428/901 X |

*Primary Examiner*—Thomas J. Herbert, Jr.
*Attorney, Agent, or Firm*—David A. Roth; Myron B. Kurtzman

[57]  ABSTRACT

Flexible circuit articles comprising microcellular film such as films from polyparabanic acid having a conductive circuit adhered to said film.

7 Claims, No Drawings

MICROCELLULAR HETEROCYCLIC POLYMER STRUCTURES

CROSS-REFERENCE TO RELATED APPLICATIONS

This is a continuation-in-part of copending application Ser. No. 643,062, filed Dec. 22, 1975 now abandoned, which in turn is a Rule 60 Divisional of Ser. No. 356,924, filed May 3, 1973 now abandoned.

Some of the preferred resins employed in accordance with the invention are disclosed in U.S. Pat. Nos. 3,591,562; 3,547,897; 3,661,859; 3,684,773; 3,637,843; and 3,635,905.

BACKGROUND OF THE INVENTION

The technique of casting polymeric articles is old and well established. In general, there are two approaches to casting. One of these is casting either a monomeric or partially polymerized syrup into a mold or shape and conveying this into an oven or autoclave in order to finish polymerizing the article with a temperature treatment. The other general type of casting involves solution casting which is also a long utilized technique for producing plastic film and sheet materials.

The general technique of solution casting involves forming a solution of the film-forming polymer into a suitable solvent, casting the resulting solution on a suitable substrate, evaporating the solvent and winding the resultant film on rolls.

Usually solvent recovery systems are employed in order to recover the solvent and minimize the loss of an expensive process component.

Solution cast opaque films have been conventionally prepared by adding pigments, fillers, flame retardants and solubilizers to a solution of the film-forming material, which pigment acts as an opacifying agent. Without such an agent such film would be colorless or transparent. Opacifying agents often embrittle the film.

Various processes have been described in the art for preparing opaque films which rely for opacity upon the presence of a large number of voids in the film. Such films may be prepared by depositing a film from an emulsion, i.e., either an oil-in-water or a water-in-oil emulsion.

When a water-in-oil emulsion is used—i.e., one in which minute droplets of water are dispersed in a continuous phase of a film forming material—the emulsion is deposited as a coating and the organic solvent which comprises the continuous phase of the emulsion is evaporated therefrom. This causes gelation of the film-forming material and entrapment of the dispersed water droplets. The water is then evaporated leaving microscopic voids throughout the film structure.

Still another technique for obtaining a porous, opaque, nonpigmented film is set forth in U.S. Pat. No. 3,031,328. Basically, this process contemplates preparing a solution of a thermoplastic polymer material in a mixture of a volatile organic solvent and a volatile nonsolvent liquid which has an evaporation rate substantially less than that of the solvent. The clear homogeneous solution is then coated on a suitable backing material and dried by evaporation to produce an opaque blushed film which is adapted to be rendered locally transparent by heat or pressure. These films are useful as recording films.

Other techniques for forming opaque, porous, non-pigmented, microporous thermosetting films are set forth in U.S. Pat. No. 3,655,591.

Nevertheless, in spite of the above, the art has never appreciated the unique articles which result when a specific type of polymer is cast in a certain manner to produce an essentially non-porous, non-foam microcellular structure which has unique and unusual properties and is incidentally opaque. The art has concentrated on techniques wherein the opaqueness is the sine qua non of the structure and the other properties are not of significance.

SUMMARY OF THE INVENTION

Unique microcellular, non-porous, non-foam polymeric articles such as films and fibers are prepared by a novel solvent/non-solvent casting technique.

DESCRIPTION OF THE PREFERRED EMBODIMENTS

It is known that films, fibers and other structures can be made out of the solvent cast polymers such as those described in U.S. Pat. No. 3,661,859, which disclosure is incorporated herein in its entirety by reference. Those particular polymers are referred to as 1,3-imidazolidene-2,4,5-trione-1,3-diyl. The repeating heterocyclic ring structure of these polymers is shown as follows:

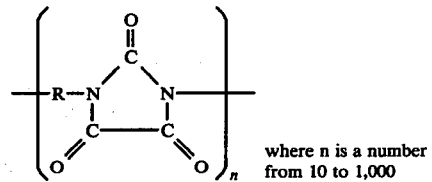

where n is a number from 10 to 1,000

Other preferred polymers are aromatic polyamides, aromatic polysulfones, and polyhydantoins which have been described in the art. See, for instance, Netherlands Pat. No. 6809916, Belgium Pat. No. 723,772, German Pat. Nos. 1,807,742; 1,805,955; 1,812,002; 1,812,003; and 1,905,367. Polyimides are well known and are described in such publications as British Pat. No. 1,240,665, U.S. Pat. Nos. 3,486,934, 3,536,666, French Pat. Nos. 1,488,924, 1,549,101, Russian Pat. No. 218,424, German Pat. No. 1,301,114, Netherlands Pat. No. 7,001,648 and the like.

The detailed preparation of these polymers and solutions of these polymers in suitable solvents are set forth in the above-recited patents and others also in the art, and therefore need not be repeated here except as is necessary to understand the invention.

The preferred microcellular structure from the polymers of the invention are characterized by high temperature thermal stability, organic solvent resistance, relative high tensile modulus, tensile strength and ultimate elongations with low shrinkage at high temperatures and are slow smoke formers when ignited.

Non-microcellular film from the preferred polymers have relatively high dielectric strengths. These properties have been found to offer outstanding advantages when used as films in flexible circuitry, for use in auto air bag circuits, light monitoring circuits, and telephone circuits because of their ability to be soldered. They also are useable for fibers, where high tenacity and modulus are required.

However, in these applications the structure has a relatively high cost per unit of weight. It would be desirable to have a structural article possessing essentially the outstanding properties of the above described non-cellular film so that it can be used for the applications listed above, but it would be less dense. If products of low density and still superior properties could be obtained, it would mean that a novel new structure of outstanding cost-performance utility would exist.

It has been discovered and forms the fundamental substance of the invention that such relatively low density microcellular structures can be prepared and are novel themselves. These films are very thin and are essentially non-porous. The technique of preparing them forms a portion of this invention.

If the advantages delineated above for the lower density material were all that the material contributed, its existence would be welcomed and its utility would be considered outstanding. Notwithstanding the outstanding utility of the lower density material, it has been discovered that the material has additional unique properties of its own which make it extremely valuable in addition to those properties enumerated above.

The preferred polymer species of the invention are polymers of 1,3-imidazolidene-2,4,5-trione, i.e. polyparabanic acid, herein referred to as PPA, and poly(imino-1,3-phenyleneiminocarbonyl-1,3-phenylenecarboxyl), hereinafter referred to as IPP. The particular conditions, reagents and uses are especially well suited for the PPA or IPP polymers and structures resulting therefrom. Nevertheless, it must be emphasized that other polymers of this invention can be handled in an analogous manner to make structures which have some similar properties. These latter include the soluble polyamide-imide, polyimides, polysulfones, polyamides, and various soluble polyhydantoins.

In general, the polymers of the invention will be comprised of sufficient repeating units to be solids at room temperature. The repeating unit can contain heterocyclic rings.

The heterocyclic ring will be 5-membered and will contain carbon, and nitrogen linkages wherein at least two of the carbons will be in the form of carbonyl groups, i.e.

which are separated by a nitrogen atom.

Examples of heterocyclic rings which fall in this case are:

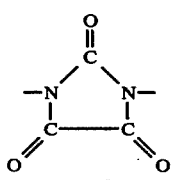 Poly(parabanic acids);

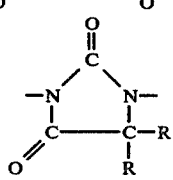 Poly(hydantoins);

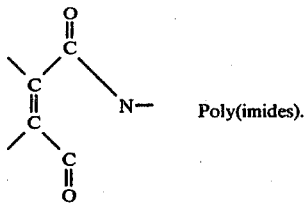 Poly(imides).

Other preferred polymers have repeating units as follows:

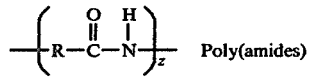 Poly(amides)

or

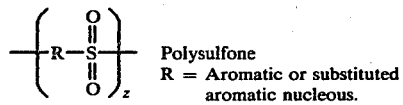 Polysulfone
R = Aromatic or substituted aromatic nucleous.

Wherein Z is a number from 20 to 1,000, preferably 50 to 200.

Although casting in general is a relatively well-known process, for each polymer and solvent system there are unique problems brought about by the particular solvents which must be used and the properties of polymer itself. Very generally, PPA's are soluble in moderate hydrogen bonding dipolar, aprotic solvents. This presents a practical problem in casting, since solvents which are available at a reasonable cost have relatively high boiling points and are of low volatility, except at relatively high temperatures. The effect of these parameters is that when PPA is cast into even relatively thin structures, a film, for instance, it is relatively difficult to remove the last small amounts of solvent from the structure, e.g. film.

For instance, dimethylformamide (DMF) is considered to be one of the best solvents for working with PPA solution formulations. It boils at 156° C. and its excellent solvating effect results in the fast dissolution of PPA along with the formation of low viscosity solutions.

Nevertheless, this combination of low volatility and high solvation, which characterize a good solvent makes the removal of the last amounts of solvent from even thin structures such as films very difficult. Therefore, film casting processes must be conducted with extremely high drying temperatures in order to get good solvent removal at reasonable production rates.

In accordance with this invention low density non-porous, microcellular film structures, e.g. PPA, aromatic polyamides and others listed above are prepared by first solvent casting of film. Prior to complete drying one precipitates the film by contacting the film with an antisolvent, such as water. A basic requirement for the antisolvent is that it be miscible with the solvent in the polymer solution.

More specifically the inventive process involves the steps of:
(a) preparing a casting solution of the polymer;
(b) casting a wet film onto a surface; or extruding a fiber;
(c) partially drying the cast film or fiber;

(d) contacting the wet film with an antisolvent such as water; and (e) removing solvent and antisolvent by completely drying the now non-porous, microcellular article.

In order to obtain a film with very low density, one can eliminate steps (c) and for step (d) expose the film to an atmosphere of high humidity.

Additives, such as flame retardants, oxidation inhibitors, plasticizers, etc. should be dissolved in the solvent with the resin prior to casting.

The solvents which can be employed in accordance with this invention are moderate hydrogen bonding dipolar, aprotic solvents. These solvents have been described in U.S. Pat. No. 3,661,859. The preferred solvents are N,N-dimethylformamide, N-methylpyrrolidone, N,N-dimethylacetamide and dimethyl sulfoxide.

The anti-solvents as mentioned above must be miscible with the solvent. Typical of the anti-solvents are water, aliphatic alcohols such as methanol, ethanol, propanol, butanol and the like; aliphatic ethers such as methyl ether, ethyl ether, methyl ethyl ether, propyl ether, methyl propyl ether, ethyl propyl ether and the like; and aliphatic ketones such as acetone, di-ethyl ketone, methyl ethyl ketone and the like. The preferred anti-solvent is water.

The concentration of the resin in the solution should be such as to not produce a viscosity which would make the solution too difficult to handle. Typically the suitable viscosities can be determined by simple experimentation.

Generally for ease of operation, the concentration of the resin in the casting solution may be such that the Brooksfield viscosity at 25° C. is between about 80 and about 800 poises. Desirably, the viscosity for the greatest ease of operation can be between about 200 and 300 poises.

Prior to casting it is desirable to filter the casting solution so as to remove any trash and gel particles.

In general, there are two methods according to the invention than can be used at step (d) described above to form the novel cellular articles of the invention. These are:

(a) Method 1—The wet film or fiber, is exposed to an atmosphere of high water humidity, followed by a direct water washing, followed by drying. As is true of all of the techniques, the thickness and shape of the structure is controlled by its original cast or extruded thickness and shape and solids content. Precipitating the structure in a high humidity environment rather than initial direct water contact is important. The reason is that too rapid precipitation and solvent removal will cause wrinkling of the structure, which is very undesirable.

(b) Method 2—The wet structure, e.g. film or fiber, is obtained by solvent casting or extrusion; then it is partially dried to a greater or lesser extent. This serves two purposes; prevents wrinkling and increases the density of the structure. Then it is water washed and dried completely. The density will vary according to the amount of solvent removed in the initial drying step.

Method 1 gives a density of about 0.45 g. per cubic centimeter, Method 2 gives a density varying from about 0.3 to 1.5 and preferably 0.3 to 1.2 g per cubic centimeter. When operating in the solution casting mode, the following considerations will be pertinent.

Density is largely dependent on the weight fraction of polymer in the wet film at the instant precipitation occurs. Casting solutions of PPA ranging above 30 weight percent resin are difficultly handled in conventional solvent casting equipment due to their very high viscosity. The high viscosity solution can nevertheless, be readily obtained through extrusion through an appropriately shaped die.

The Method 1 technique contemplates the use of the most viscous solution that can be handled, i.e. 20 to 50 weight percent PPA depending upon molecular weight of the polymer.

Method 2 permits the use of a more dilute solution with its concomitant easier handling advantages, and relies upon the evaporation of more solvent from the film after it is cast and prior to first precipitation. This allows a wider range of densities than can be obtained by Method 1.

The practical limit which sets the maximum density which can be obtained in Method 2 is the minimum amount of solvent which must remain in the polymer in order for precipitation to occur when the cast polymer solvent structure is contacted with water or other antisolvent.

The minimum density of Method 2 is limited by the maximum amount of solvent that can be left in the wet film at the precipitation step, which will not cause surface wrinkles on the film or fiber surface. This will vary depending on the choice of anti-solvent as can be simply determined.

The range of densities can be further increased by (a) calendering the resulting cellular film, (b) orienting the film and the fibers to elongate and reduce the volume of the cellular portions, or (c) the use of different mechanical equipment designed to handle the extremely viscous polymer solutions, for example slot extruders. That latter approach would increase the density of the microcellular material approximately proportionately to the amount of solvent reduction in the original polymer solvent solution. Thus when solution extrusion equipment is used, much higher polymer solvent contents can be handled as compared to the casting methods described above.

In accordance with this invention the non-porous microcellular structures can be prepared as a free film, a permanent coating on a surface or as an impregnating substance.

The free film is prepared by laying down a layer of casting solution onto the desired flat surface which conveys the wet layer sequentially into a drying zone so as to partially dry the film, a water zone (bath, vapor or spray) and to a final drying zone. Suitable surfaces which may be employed are metal, which has been polished or embossed, chrome plated metals, release paper and others known in the casting art. When needed, a release agent can be included in the casting solution to facilitate removing the finished film from the casting surface. As indicated above, so as to obtain a very low density film, the first drying step can be eliminated.

Suitable equipment for laying down the wet film of casting solutions are casting boxes, reverse roll coaters and pressured extrusion dies. The choice depends upon the thickness of wet film to be laid down and the viscosity of the casting solution. With casting solutions having a Brookfield viscosity less than 200 poises one can employ a reverse roll coater. Intermediate viscosities and wet film thickness are handled best by casting boxes. The typical ranges are Brookfield viscosities of 100 to 300 poises at wet film thickness of 10 to 30 mils. Very high viscosities, 300 to 1000 poises require extrusion die equipment. Other methods of laying down film would be known to those practitioners in the art.

The wet film exposed to the first drying zone will have the initial composition of the casting solution. After partial drying or in the absence of the partial drying step the solvent content of the film should preferably be between about 20% to 50% by weight. Nevertheless, greater or lesser percentages may be employed. However, if less than 20% solvent is present, the desired cellular structure will be formed in the water zone slowly and the cellular structure will not as perfectly formed. If the residual solvent is greater than 50%, the rate of water absorption will be too rapid causing the film to be deformed. In between a well formed cellular structure will be produced with little or no film deformation.

The water zone may consist of water vapor, water spray, a water bath, or any combination of these as long as water is rapidly absorbed by the film. In addition to water being absorbed into the film, solvent is extracted from the film such that the solvent content of the microcellular film should be less than 10%. During the final drying step, the microcellular film will tend to melt with loss of microcellular structure if the solvent content is much greater than 10%.

As the film is partially dried and as it is contacted with water the film thickness and cell diameter will decrease due to removal of solvent.

The film is dried in a final drying zone which preferably is a staged zoned oven having temperature gradient of from 175° to 270° C. The final solvent content is usually <3000 ppm. A further reduction in film thickness and cell diameter occurs during the final drying.

The properties of the finished microcellular film are basically determined by (1) film thickness, (2) film density, and (3) cell diameter. It is apparent that final film thickness is substantially less than that of the initially cast wet film since as indicated above the thickness is reduced in each step of the casting operation. The largest reduction must occur in the first drying zone since from 40% to 75% of the solvent is desirably removed. Thus, if a particular thickness of finished microcellular film is to be obtained, the initially cast wet film must be from 2 to 3 times this thickness. The upper practical limit of thickness of the finished microcellular film of this invention is about 20 mils. This is to be contrasted with foams which are formed by an expansion process. Thus, the thickness of the foamed article and the cell diameter increase during the foaming process. This imposes a practical lower limit of greater than 20 mils thickness for foamed articles. The lower practical thickness for these microcellular film is about 1 mil which is far below that attainable by foaming. Hence, as a practicable matter the films of this invention range from about 1 mil to about 20 mils in thickness.

Film density is governed by the volume fraction of the microcells. For example, if the volume fraction is 0.50, then the density of the microcellular film will be 50% of that of dense film from the same resin. The density of microcellular film has a practical lower limit of about 30% of the dense film value. The upper limit is about 90% of the dense film value. Foams by contrast are usually less than 30% of the corresponding dense article. The range of cell diameters usefully employed in accordance with this invention can be from about 0.1 to about 10 microns. Although cell sizes can be greater or lesser, for most useful applications, the smallest cell diameter is preferred such as from about 0.1 to about 5 microns, although there are some exceptions to this rule. In any event, the mechanical strength, compressability and toughness are increased the smaller the microcells for any given film density. By contrast, foamed articles usually contain cells having greater than 10 microns diameter and their mechanical strength and toughness are low. The shape and distribution of the microcells are also important. In general, microcellular articles, however they may be made, have structures made up of either open or closed cells. All of the film of this invention contain predominantly isolated spherical closed cells which have such a uniform distribution that only occassionally do two cells impinge on one another. By virtue of the essentially discrete spherical closed cells, the transmission of gases, vapors and liquids are so slow the film that it can be considered to be impermeable when compared to semi-permeable microporous membranes and foams.

Cellular film made from PPA solutions in DMF were prepared on equipment which is normally used to make porous cellulose acetate film for electrophoresis applications. The equipment consisted of a casting box applicator, a sixty-foot continuous stainless steel belt, and four chambers equipped to control humidity, temperature and the rate of air flow.

Provisions were also incorporated to spray water onto the moving continuous belt for the purposes of initial precipitation and for washing the solvent from the film.

The first technique used was that described for Method 1. And the polymer was PPA in 20% concentration in DMF. The humidity was controlled at 90°–95° in the first zone. The film initially precipitated due to absorption of water vapor. Additional precipitation and solvent removal was affected by direct immersion in a water bath followed by drying.

Under these conditions of high humidity the wet film absorbs water vapor rapidly due to the hydroscopic nature of the DMF solvent but much slower than if directly immersed in water. Films having a uniform cellular structure were obtained having densities of about 0.45 g. per cubic centimeter.

The belt speed varied from about 0.50 feet per minute to about 2.5 feet per minute. The temperature was about 100° F. The air rate was about 900 to 1,300 cu. ft. per minute. The thickness of the wet film varied from about 8 mils to about 20 mils. The total time in the oven ranged from about 6 minutes to about 15 minutes. Generally time periods above 10 minutes and less than 20 minutes appeared to be satisfactory.

Subsequent work has been done to produce cellular films which have relatively high densities, i.e. up to 1.1 gm/cc.

For this, the above-described equipment was modified somewhat to permit the use of a Method 2 type approach. It required the addition of heaters to the first chamber in order to provide for some gradual initial solvent removal, which is a step required to control the increase in the density of the film and to prevent wrinkling. Equipment to spray water onto the moving stainless steel belt was installed in the second chamber to precipitate the film. Water sprays in the third and fourth chambers were provided in order to wash out additional solvent, e.g. N,N-dimethylformamide (DMF) prior to stripping the film off the belt and subsequent drying.

Passage of the solvent loaded film into an irregular water interface produced a non-uniform surface on the precipitated film. Therefore, an air knife was installed which directed an air flow downward onto the surface of the belt and provided a relatively uniform water interface for the wet film to pass into.

Although useful microcellular articles in particular foams and semi-permeable membranes having thickness >0.020" have previously been known, such structures have not been found to have utility as a high performance engineering material in thinner gauges. By contrast, they tend to be of relatively low strength. For the first time, the microcellular film of this invention provide materials in thin gauges which combine the properties necessary for high performance engineering materials with some of the desirable characteristics of light weight microcellular materials. Some of the more important properties are illustrated in Table I where microcellular PPA-M is compared to several commercial foams and dense film made from engineering plastics. The aromatic polyamides, polyimides, polyhydantoins, polysulfones and polyamide-imides of this invention have properties similar to the PPA films.

especially where transmission is to be over relatively long distances. In an analogous fashion, the lower thermal conductivity makes these structures desirable for thermal insulation.

As is the case of the dense film, the cellular film also withstands commercial solder bath temperatures, i.e. 500° F. vs. <300° F. for foamed sheetings.

One important and highly advantageous property of the cellular film, as opposed to the dense film is that copper circuits can be electroplated directly onto the cellular film, with much higher peel strengths for the electroplated copper on the cellular film than on the dense film.

For example, peel strengths for copper electrodeposited on the dense film were in the range of about 2.5 to 3.0 pounds per inch. But peel strengths on copper electrodeposited onto the microcellular film were in the range of about 8 pounds per inch.

This is an extremely important aspect of the cellular film which gives it an outstanding advantage, taken in combination with its other properties, over dense film.

Not only are the adhesion values exceedingly high for the electroplated copper circuit on cellular film, and

TABLE I

| | Cellular PPA-M Film | Commercial Foams (Flexible Sheets) | | Non-Cellular Film | | |
|---|---|---|---|---|---|---|
| | | Poly Urethane(a) | Poly Styrene(a) | PPA-M | Poly Carbonate(a) | Poly Sulfone(a) |
| Density (gm/cc) | 0.5–1.0 | 0.02–0.04 | 0.16 | 1.35 | 1.2 | 1.25 |
| Tensile Strength (psi) | 5000–10,000 | 8–25 | 600–1000 | 14,000 | 8,600 | 9,500 |
| Elongation (%) | 100–150 | (b) | (b) | 50–100 | 85–105 | 64–100 |
| Tearing Strength (gm/mil) | 8–15 | (b) | (b) | 6–10 | 20–25 | 9–12 |
| Dielectric Constant ($10^3$cps) | 1.5–2.8 | 1.0–1.5 | 1.28 | 3.4 | 3.0 | 3.1 |
| Dielectric Strength (KV/mil) | 0.5–3.0 | <0.5 | <0.5 | 3–5 | 1.5 | 2.5–7.5 |
| Resistance to Heat (°F.) | 525° F. | 275° F. | 175° F. | 525° F. | 270° F. | 350° F. |

(a)Properties from "Modern Plastics Encyclopedia" 1974–75.
(b)Property not listed.

The above data show that microcellular PPA-M film are competitive with a widely used non-cellular film from engineering thermoplastics in tensile strength, % elongation, tearing strengths and dielectric strengths. On the other side, the dielectric constant of the microcellular film of this invention is comparable to the very structurally weak foamed sheetings. The very low dielectric constant is of great utility when used in electrical insulation for both power and signal transmission. Thus, the microcellular film of this invention provide a dielectric insulation which has a desirably low dielectric constant and at the same time high dielectric and mechanical strengths. Semi-permeable membranes although not used for structural or insulation application would be even less useful than foam in these applications due to their high porosity and low strengths.

Although it is predictable that mechanical properties such as modulus and tensile strength will decrease with decreasing density, it was found that these mechanical properties were not sufficiently diminished to seriously affect the utility of the cellular article for many applications. Moreover, in the case of the film, the propogating tear strength was better than that of the dense film.

The dielectric constant will decrease with decreasing density, and therefore, the dielectric constant for the cellular products are lower than that for the dense film products. This makes the cellular film more attractive also laminates prepared with adhesives but the use of the cellular film permits the omission of a bothersome process step. Thus, before copper laminated onto plastic films which normally contain small quantities of absorbed water can be soldered, the unit must be dried to remove absorbed water. If it is not, the absorbed water tends to be driven from the film during the soldering operation, because of heating of the composite unit. This rapid generation of steam causes the copper to be delaminated from the film substrate.

When the cellular film of the invention is utilized, the copper does not delaminate. It is theorized that this is due to the fact that there are numerous microcellular voids into which the water can expand rather than escaping through the surfaces. Therefore, delamination is effectively prevented. This is an exceedingly useful property.

These films are much more flexible than dense film of the same thickness, which is an advantage for thick multilayer structures.

Another important feature of the structures of the invention involves selective surface etching by strong bases or acids. This removes the film covering the microcells, either completely or in any pattern desired. The exposed microcells, can then be electro or chemically plated with far better adhesion. In fact, grooves can be etched into the surface into which conductive metals can be deposited with excellent adhesion to the exposed microcells and with excellent separation and insulation from adjacent conductor-filled grooves.

All in all, cellular film, because of its combination of properties and its relatively low cost is an ideal material for flexible circuits and flat conductor cables.

The preferred structures produced by the practice of this invention are characterized by the presence therein of a large number of discrete closed cells. Substantially all of these cells or voids are less than 25 microns, and preferably less than 2 microns, in size. Most preferably the cell size is less than 5 microns. The average cell size and cell size distribution is governed by the conditions under which the structures are made, e.g., temperature solvent, antisolvent, polymer solids content of casting solutions, etc. The range obtainable is from about 0.1 to 25 microns.

Unless some color-forming material has been included in the composition, such as a soluble dye, the preferred films of this invention are opaque and off white. Colored films may be obtained by incorporating small amounts of dyes.

A film having an apparent thickness of, for example, 10 mils will have a real solid thickness which is equal to the sum of the thickness of each wall between the discrete cells lying along a path perpendicular to the outermost planar surface of the film which may be, for example, no more than 3 mils. Thus, the film is of sufficient apparent thickness to provide the required amount of strength.

Furthermore, the diffusion per unit of time of a vapor or a liquid through a unit area of the films of this invention is far smaller than semi-permeable membranes.

The compositions of this invention are particularly useful when precipitated onto fabrics made from fiber glass, resinous yarns, vegetable or cellulosic yarns and cords. When these fibers or cords are coated with the structures of this invention, an opaque or white fabric is obtained without the addition of pigments as needed in the fabric heretofore employed. These coated fabrics have very desirable flexibility. The fact that pigments such as $TiO_2$ are not needed to obtain whiteness in fibrous fabrics is quite significant since this has been a problem in the art due to the adverse effects these pigments have on the resulting fabrics. For example, it is known that pigments such as $TiO_2$ weaken the tensile strength of the fabric.

The fibers may be coated with the compositions of this invention by either of the first two methods described above. One method found to be suitable is to dip the fibers into a solution which contains resin, solvent and non-solvent in amounts indicated hereinabove. Upon precipitation a fabric having the desired whiteness and softness is obtained without the addition of pigments such as $TiO_2$.

Although the above discussion has been made with reference to films as discrete articles, it is to be noted that films in terms of surface coatings with unique and important properties and which are bonded to a substrate can also be produced according to the technique of the invention.

The structures of this invention may be formed as surface coating films by either of the techniques described above. Thus, they may be applied by extrusion, brushing, spraying, dipping, roller coating, or knife coating followed by precipitation and drying.

The compositions of this invention are particularly useful when employed in spray applications.

As already indicated compositions of this invention may be applied as films to various types of surfaces or substrates. These surfaces may be of the type whereby the film is to be removed by a suitable method or of the type where it is adhered to the final substrate such as the metal of an automobile. Among the more suitable surfaces which may be coated with the cellular structures of this invention are steel, treated steel, galvanized steel, concrete, glass, fabrics, fiber glass, wood, plaster board, aluminum, treated aluminum, lead, copper and plastics. The most preferred surfaces are metals such as treated steel and treated aluminum.

Films formed from the compositions of this invention may be air dried, vacuum dried or bake dried at elevated temperatures.

Although considerable emphasis has been placed on cellular film formation and applications, it is an important feature of this invention that cellular fibers of high strength can be produced utilizing the technique of the invention.

Fibers made by the conventional wet spinning techniques of the art are never left in cellular form, but are remelted and oriented in order to eliminate the cellular structure which gives rise to fibers having low modulus. In this invention the polymers used have such a high modulus that the microcellular fibers can be used with only moderate-orientation. Ordinarily orientation is used to improve fiber strength.

This gives rise to a microcellular fiber which can accept dyes readily. Moreover, the fiber has the capacity to absorb moisture. Thus, it will be comfortable in contact with the human body. The capability of absorbing moisture is often the difference between synthetic fabrics which may feel clammy and natural fabrics such as cotton, the latter being much more comfortable because of its water absorptive capacity. Permanent press fabrics can be made due to high softening temperatures of these novel fibers.

The microcellular films, fibers and other structures can also be electrocoated with various metals such as copper, aluminum and the like in order to form thin conductive coatings with a minimum of coating metal.

Electrocoated structures can be used in a wide variety of decorative and utilitarian applications. These involve automotive trim, under-the-hood uses, and radiation shields.

Electrodeposition and chemical metalizing can also be used to coat catalytic metals such as paladium, platinum, nickel, and the like within the interstices of the structure so that it can be used to form an extremely high surface area, artificial surface for conducting catalytic reactions at relatively high temperatures.

The cellular structures of the invention are also highly useful for specialty applications where highly tenacious painted surfaces are required.

The invention is further illustrated by the following examples.

EXAMPLE 1

Utilizing the technique and apparatus described above, a series of runs was carried out in the apparatus. A casting solution was prepared by combining 19.7 weight percent PPA, 79 weight percent DMF and 1.3 weight percent of octabromobiphenyl (which is an excellent flame retardant for PPA film).

All PPA utilized in these examples was prepared from the reaction of HCN with diphenyl methane diisocyanate.

Three rolls of wet film were cast onto a moving belt from the prepared solution and partially dried in a circulating air oven at 180° F. Upon exiting from the oven the film was rapidly precipitated by spraying with water, followed by immersion in a water bath and completely dried in a circulating air oven.

A fourth film was cast as a control but was not subjected to the water bath so as to obtain conventional non-cellular product.

The resulting level of octabromobiphenyl in the dense film was about 6 weight percent. Such a level of flame retardant resulted in an oxygen index of 32 to 34, depending on thickness and density of the film, as can be seen above.

The casting conditions and resulting properties are summarized in Table II.

TABLE II

| Film | Density gm/cc | Dry Film Thickness mils | Tensile Modulus psi | Propagating Tear Strength gm/mil | Dielectric Strength volts/mil | Oxygen Index | Time In First Drying Oven Minutes | Wet Film Thickness Mils |
|---|---|---|---|---|---|---|---|---|
| Roll A | 0.90 | 5.6 | 143,000 | 14.8 | 1029 | 32.9 | 13.0 | 18 |
| Roll B | 1.10 | 4.5 | 249,000 | 17.2 | 1400 | 34.0 | 17.3 | 18 |
| Roll C | 0.65 | 6.0 | 134,000 | 14.0 | 965 | 32.9 | 10.4 | 19 |
| Control | 1.3 | 2.0 | 300,000 | 8.0 | 5000 | — | | |

EXAMPLE 2

A casting solution for an aromatic polyamide was prepared by stirring a mixture of 16 grams of poly(imino-1,3-phenyleneiminocarbonyl-1,3-phenylenecarbonyl), 59 grams of N,N-dimethyl acetamide and 4.4 grams of lithium chloride which is employed so as to facilitate solubilizing the polymer. A 25 mil wet film was cast onto a glass plate and placed in a circulating air oven for 20 minutes and at a temperature of 200° F. so as to partially remove the solvent. The clear film on the glass plate was then immersed in water for one hour and thereafter dried at 350° F. for three hours. A tough, opaque, flexible, non-porous microcellular film having good physical and electrical properties was produced.

EXAMPLE 3

This Example is illustrative of method 1 described above wherein very low density, non-porous, microcellular film can be obtained by exposing the film to water vapor prior to any drying, i.e. the film is not partially dried before contact with water.

A 15% by weight of polysulfone (from Union Carbide), having the structure

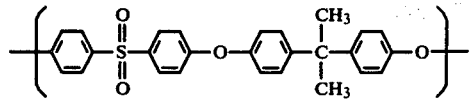

was prepared using N,N-dimethyl formamide. The solution was cast onto a glass plate and exposed to humid air until a microcellular structure was formed as indicated by an opaque off-white color. The film was removed after one hour and dried at 150° C. for one hour. The dried film was non-porous, microcellular, flexible and tough.

EXAMPLE IV

A solution of 10 grams of polyhydantoin (Bayer 4089) was dissolved in 40 grams of N,N-dimethyl formamide. A 20 mil thick wet film was cast onto a pyrex glass plate and put into an air swept drying oven and held at 250° F. for five minutes. The partially dried clear film was immersed in water for four (4) hours. The now opaque film was removed from the water and dried 30 minutes at 250° F., 30 minutes at 350° F. and four hours at 400° F. The dried film was opaque, non-porous, microcellular, flexible and tough.

The microcellular structures of the invention can have incorporated therein a wide variety of small particle additives and/or fillers. The resulting structures are relatively non-brittle compared to a dense structure containing a comparable amount of filler or additive.

Illustrative examples of additives are flame retardants, antioxidants, pigments and the like.

The cellular structures will also be highly useful as separators in fuel cells which do not utilize alkaline electrolytes. The high temperature resistance, strength and ability to be adhered to conductors such as metals and carbon as well as the ease of electroplating a strong adherent metal film to the microcellular structures make them uniquely suitable for many fuel cell and battery component applications.

Furthermore, the ability of the dense and cellular materials described herein to both adhere tenaciously to metals, carbon graphite, etc., substrates as well as their high temperature solvent and corrosion resistance to virtually all chemical substances except aprotic solvents and alkalies makes these polymers outstanding material for tank linings, pipe coatings and other thin film protective coatings. Their low permeability properties (denser film) are also significant in this application.

Another unique and highly useful application of the microcellular film coatings, especially PPA, relies on the unusual low temperature performance of these polymers. Thus, coatings for pipes and electrical cable conduit wraps can be used in extremely adverse low temperature, environments as low as about −268° C., with no adverse affect. This permits use with liquid helium and liquid nitrogen without losing flexibility and with low dissipation factors.

This permits PPA (cellular film), to be used as insulating and protective materials in low temperature conductors. Such low temperature conductors are the clear trend of the future and PPA should play an important role in these environments.

What is claimed is:
1. A flexible circuit article comprising:
 (a) a closed cell, nonporous, non-foam microcellular polymeric article having a density of about 0.3 g/cc to about 1.5 g/cc in the shape of a film having a thickness of from about 1 mil to 20 mils, the polymeric article comprising a polymer selected from the group consisting of aromatic polyparabanic acids, aromatic polyhydantoins, aromatic polyamides, aromatic polyimides, aromatic polysulfones, aromatic polyimides-amides and combinations thereof; and

(b) a conductive circuit adhered to said film in a prearranged configuration.

2. A flexible circuit according to claim 1 wherein said conductive material is copper.

3. An article according to claim 1 wherein said conductive material has been electrodeposited on said film-shaped article.

4. An article according to claim 1 wherein said metal is aluminum.

5. A flexible circuit article of claim 1 wherein said polymer is an aromatic polyparabanic acid.

6. A composite semi-conductor article comprising a closed cell, nonporous, non-foam microcellular polymeric film having a thickness of from about 1.0 mil to 20 mils and a density of from about 0.3 g/cc to about 1.5 g/cc, the polymeric film comprising a polymer selected from the group consisting of aromatic polyparabanic acids, aromatic polyhydantoins, aromatic polyamides, aromatic polyimides, aromatic sulfones, aromatic polyimides-amides and combinations thereof, which film has adhered to it a prearranged configuration of a metal oxide semi-conductor (MOS).

7. A composite semi-conductor article of claim 6 wherein said polymer is an aromatic polyparabanic acid.

* * * * *